(12) United States Patent
Renteria et al.

(10) Patent No.: US 8,764,493 B2
(45) Date of Patent: Jul. 1, 2014

(54) INTEGRATED CONNECTOR APPARATUS AND METHODS

(75) Inventors: Victor H. Renteria, Poway, CA (US);
Aurelio J. Gutierrez, Bonita, CA (US);
William Mahlerbe, Temecula, CA (US);
Gary L. Hurd, San Diego, CA (US);
Russell L. Machado, San Diego, CA (US)

(73) Assignee: Pulse Electronics, Inc., San Diego, CA (US)

( * ) Notice: Subject to any disclaimer, the term of this patent is extended or adjusted under 35 U.S.C. 154(b) by 0 days.

(21) Appl. No.: 13/437,856

(22) Filed: Apr. 2, 2012

(65) Prior Publication Data

US 2012/0196456 A1 Aug. 2, 2012

Related U.S. Application Data

(63) Continuation of application No. 12/074,112, filed on Feb. 28, 2008, now Pat. No. 8,147,278.

(60) Provisional application No. 60/904,488, filed on Mar. 1, 2007.

(51) Int. Cl.
*H01R 13/66* (2006.01)

(52) U.S. Cl.
USPC .......................................................... 439/676

(58) Field of Classification Search
USPC .................................... 439/620.01, 676, 76.1
See application file for complete search history.

(56) References Cited

U.S. PATENT DOCUMENTS

| | | | |
|---|---|---|---|
| 3,985,310 A | 10/1976 | Kent et al. | |
| 4,296,991 A * | 10/1981 | Hughes et al. | 439/676 |
| 4,653,838 A | 3/1987 | Ney et al. | |
| 5,069,641 A * | 12/1991 | Sakamoto et al. | 439/620.22 |
| 5,531,612 A | 7/1996 | Goodall et al. | |
| 5,587,884 A | 12/1996 | Raman | |
| 5,647,767 A | 7/1997 | Scheer et al. | |
| 5,736,910 A | 4/1998 | Townsend et al. | |
| 5,759,067 A | 6/1998 | Scheer | |
| 5,766,043 A * | 6/1998 | Talend | 439/676 |
| 5,971,805 A | 10/1999 | Belopolsky et al. | |
| 6,062,908 A | 5/2000 | Jones | |
| 6,116,693 A | 9/2000 | Zammit | |
| 6,159,050 A | 12/2000 | Belopolsky et al. | |
| 6,171,152 B1 | 1/2001 | Kunz | |
| 6,176,741 B1 | 1/2001 | Shutter | |
| 6,193,560 B1 | 2/2001 | Morana et al. | |
| 6,224,425 B1 | 5/2001 | Shutter | |

(Continued)

FOREIGN PATENT DOCUMENTS

CN 1663078 8/2005

*Primary Examiner* — Alexander Gilman
(74) *Attorney, Agent, or Firm* — Gazdzinski & Associates, PC

(57) ABSTRACT

An electrical connector mountable on a printed circuit board. In one embodiment, the electrical connector comprises an insulative housing comprising one or more electronic components, a plurality of electrical conductors in signal communication with the electronic components and adapted to interface with a plug and a plurality of terminals in signal communication with the one or more electronic components. In one aspect, the plurality of terminals are adapted to interface with one or more externally mounted electronic components on the printed circuit board thereby filtering signals passing between the electrical conductors and the printed circuit board, with the externally mounted electronic components mounted within the footprint of the electrical connector. Methods of manufacture for the aforementioned electrical connector and business methods are also disclosed.

21 Claims, 12 Drawing Sheets

(56) References Cited

U.S. PATENT DOCUMENTS

| | | | |
|---|---|---|---|
| 6,238,247 B1 | * | 5/2001 | Belopolsky et al. ..... 439/620.18 |
| 6,319,064 B1 | * | 11/2001 | Belopolsky et al. ..... 439/620.19 |
| 6,325,664 B1 | | 12/2001 | Someda et al. |
| 6,409,548 B1 | | 6/2002 | Guttierez |
| 6,431,917 B1 | * | 8/2002 | Belopolsky et al. .......... 439/676 |
| 6,471,551 B2 | | 10/2002 | Morana et al. |
| 6,585,540 B2 | | 7/2003 | Gutierrez et al. |
| 6,642,827 B1 | | 11/2003 | McWilliams |
| 6,695,649 B1 | * | 2/2004 | Ciezak et al. ................ 439/676 |
| 6,736,680 B2 | | 5/2004 | Slack et al. |
| 6,738,680 B2 | | 5/2004 | Nesbitt |
| 6,761,595 B1 | | 7/2004 | Zheng et al. |
| 6,769,936 B2 | | 8/2004 | Gutierrez et al. |
| 6,773,298 B2 | | 8/2004 | Gutierrez |
| 6,773,302 B2 | | 8/2004 | Gutierrez et al. |
| 6,786,772 B1 | | 9/2004 | Liu |
| 6,811,442 B1 | * | 11/2004 | Lien et al. ................ 439/620.07 |
| 6,848,943 B2 | | 2/2005 | Machado et al. |
| 6,881,096 B2 | * | 4/2005 | Brown et al. ............ 439/620.01 |
| 6,926,558 B2 | * | 8/2005 | Sasai et al. ............... 439/620.04 |
| 6,962,511 B2 | | 11/2005 | Gutierrez et al. |
| 6,986,684 B1 | * | 1/2006 | Lien ........................ 439/620.07 |
| 7,241,181 B2 | * | 7/2007 | Machado et al. ............. 439/676 |
| 7,744,429 B2 | * | 6/2010 | Zhang et al. .................. 439/676 |
| 8,147,278 B2 | * | 4/2012 | Renteria et al. ............... 439/676 |
| 2004/0102099 A1 | | 5/2004 | Han et al. |
| 2005/0136731 A1 | * | 6/2005 | Brown et al. ................. 439/490 |
| 2005/0142952 A1 | * | 6/2005 | Peng ............................ 439/676 |
| 2006/0057889 A1 | | 3/2006 | Saitou |
| 2006/0128228 A1 | * | 6/2006 | Wan et al. ..................... 439/676 |
| 2007/0015416 A1 | | 1/2007 | Gutierrez et al. |
| 2007/0238359 A1 | | 10/2007 | Gutierrez et al. |
| 2008/0136716 A1 | | 6/2008 | Annamaa et al. |
| 2008/0186124 A1 | | 8/2008 | Schaffer et al. |
| 2008/0220657 A1 | | 9/2008 | Rascon |
| 2008/0248695 A1 | * | 10/2008 | Hu et al. .................. 439/620.22 |
| 2011/0097935 A1 | * | 4/2011 | Schempp et al. ........ 439/620.22 |

* cited by examiner

SECTION A-A

INTEGRATED CONNECTOR APPARATUS AND METHODS

PRIORITY

This application is a continuation of and claims priority to U.S. patent application Ser. No. 12/074,112 filed Feb. 28, 2008 of the same title, which claims priority to U.S. Provisional Patent Application Ser. No. 60/904,488 filed Mar. 1, 2007 of the same title, each of the foregoing incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

FIELD OF THE INVENTION

The present invention relates generally to electrical or electronic connector systems and in one exemplary aspect, to filtered connector apparatus and systems for telecommunications applications, and methods for manufacturing the same.

DESCRIPTION OF RELATED TECHNOLOGY

Modular connectors, such as for example those of the "RJ" configuration, are well known in the electronics industry. Such connectors are adapted to receive one or more modular plugs of varying type (e.g., RJ-45 or RJ-11), and communicate signals between the terminals of the modular plug and the parent device with which the connector is associated. Commonly, some form of signal conditioning (e.g., filtering, voltage transformation, or the like) is performed by the connector on the signals passing through it.

Many different considerations are involved with producing an effective and economically viable connector design. Such considerations include, for example: (i) volume and "footprint" available for the connector; (ii) the need for electrical status indicators (e.g., LEDs); (iii) the cost and complexity associated with assembling and manufacturing the device; (iv) the ability to accommodate various electrical components and signal conditioning configurations; (v) the electrical and noise performance of the device; (vi) the reliability of the device; (vii) the ability to modify the design to accommodate complementary technologies; (viii) compatibility with existing terminal and "pin out" standards and applications; (ix) ability to configure the connector as one of a plurality of ports, potentially having individually variant internal component configurations, and (ix) potentially the maintenance or replacement of defective components.

Electrical connectors (including modular jacks) are increasingly used in data networking applications, such as wired or wireless LANs, whether for computers or other electronic devices (such as routers, gateways, hubs, switching centers, digital set-top boxes, etc.). Increasing requirements for data connectivity and capability are driving greater adoption of these connectors across a broader spectrum of applications. Increased data rate requirements, such as those mandated under so-called "gigabit Ethernet" (GBE) standards, are also increasing the performance demands on these connectors. As more capability and components (such as both discrete and integrated circuitry) are disposed within the connector, more efficient use of the available volume within the connector, and more efficient heat dissipation, are also required.

The foregoing factors have resulted in myriad different (and often highly specialized) configurations for modular connectors in the prior art. Many of these designs utilize an internal PCB or substrate for carrying electronic or signal conditioning components internal to the connector housing. For example, U.S. Pat. No. 5,069,641 to Sakamoto, et al. issued Dec. 3, 1991 and entitled "Modular jack" discloses a modular jack to be mounted on a circuit board, and the modular jack has a printed board containing a noise suppressing electronic element in a housing. The printed board is fitted with contactors for contacting with plugs and terminals to be used for mounting the modular jack on the circuit board. The contactors and the terminals are electrically connected with the noise suppressing electronic element by wires on the printed board.

U.S. Pat. No. 5,531,612 to Goodall, et al. issued Jul. 2, 1996 entitled "Multi-port modular jack assembly" discloses a modular jack assembly for mounting to a printed circuit board, is shown comprising a plurality of modular jacks assembled to a common integral housing and disposed in back-to-back mirror image symmetry. Shielding, is provided around the connector assembly and shielding between the two rows is also provided for suppressing cross-talk there between. The design is compact, providing for a large number of ports without increasing the length of the connector assembly, whilst also providing good access to the resilient locking latches of complementary modular plugs received by the jacks.

U.S. Pat. No. 5,587,884 to Raman issued Dec. 24, 1996 and entitled "Electrical connector jack with encapsulated signal conditioning components" discloses a modular jack electrical connector assembly suitable for conditioning the signals in unshielded twisted pair wires for use with network components is disclosed. The modular jack comprises a conventional insulative housing and an insert subassembly including insert molded front insert member and rear insert member. Contact terminals for mating with a modular plug extend from the front insert member and into the rear insert member. The rear insert member also includes signal conditioning components such as common mode choke coils, filter circuits and transformers suitable for conditioning the twisted pair signals for used in applications such as for input to and output from IEEE 10 Base-T network components.

U.S. Pat. No. 5,647,767 to Scheer, et al. issued Jul. 15, 1997 and entitled "Electrical connector jack assembly for signal transmission" discloses a modular jack electrical connector assembly for conditioning the signals in unshielded twisted pair wires for use with network components. The modular jack comprises a conventional insulative housing and an insert subassembly including an insert molded front insert member and a rear insert member. Contact terminals for mating with a modular plug extend from the front insert member and into the rear insert member. The rear insert member also includes signal conditioning components such as common mode choke coils, filter circuits and transformers suitable for conditioning the twisted pair signals for used in applications such as for input to and output from IEEE 10 Base-T network components. The rear insert member includes an insert molded body which stabilizes the position of the contact terminals and leads extending from the rear insert member for attachment to external circuits, such as the external printed circuit board containing the interface processor for the specific application.

U.S. Pat. No. 5,759,067 entitled "Shielded Connector" to Scheer exemplifies a common prior art approach. In this configuration, one or more PCBs are disposed within the connector housing in a vertical planar orientation such that an inner face of the PCB is directed toward an interior of the assembly and an outer face directed toward an exterior of the assembly.

U.S. Pat. No. 6,062,908 to Jones issued May 16, 2000 entitled "High density connector modules having integral filtering components within repairable, replaceable submodules" discloses a connector module for mounting on a circuit board includes a housing and at least one plug-receiving opening for receiving an RJ-45 or other similar jack. Each plug-receiving opening includes contact portions that make electrical contact with individual conductors, e.g., twisted pair conductors, connected to the RJ-45 jack. A plurality of connection pins protrude from a bottom surface of the housing and facilitate mounting of the modular connector onto the circuit board. Protection/filtering circuitry, located within vertical space inside of the housing so as to reside adjacent the connection pins, electrically couples and minimizes the electrical distance between the contact portions associated with each plug-receiving opening and the plurality of connection pins. The protection/filtering circuitry includes at least one ring-shaped ferrite core. Light emitting diodes may also be included as an integral part of the module, but are mounted for viewing so as to be outside of the shielded portions of the module.

U.S. Pat. No. 6,159,050 to Belopolsky, et al. issued Dec. 12, 2000 entitled "Modular jack with filter insert" discloses a modular jack assembly which includes an outer insulative housing having top and bottom walls and opposed lateral walls while defining an interior section. This housing also has front and rear open ends. This assembly also includes an insulative insert having a top section, an upper side and rear section having a base side and a recess. This jack is positioned so that the upper side of its top section is adjacent to top side of the insulative housing such that its terminal end extends into the interior section of the insulative housing and the rear section at least partially covers the rear open end of the insulative housing. This assembly also includes an electronic component mounted in the rear section of the insulative insert. A conductor is mounted in the electrical insert.

U.S. Pat. No. 6,171,152 to Kunz issued Jan. 9, 2001 entitled "Standard footprint and form factor RJ-45 connector with integrated signal conditioning for high speed networks" discloses an RJ-45 style modular connector having a plastic rectangular housing with an open front end to receive a matching RJ-45 style modular jack, and an opposite open back end. A contact spring assembly of a plurality of wires in separate circuits passes forward through said open back end into the back of said open front end of the housing. The contact assembly also includes a plastic block that supports the plurality of wires by a right angle turn and is vertically oriented with respect to the plurality of wires, and the plastic block inserts and locks into the open back end of the housing. A set of mounting pins is disposed at a bottom edge of the plastic block for connection to a printed motherboard. A signal conditioning part is disposed in the plastic block for providing signal conditioning of signals passing from said set of mounting pins to the contact spring assembly.

U.S. Pat. No. 6,585,540 to Gutierrez, et al. issued Jul. 1, 2003 and entitled "Shielded microelectronic connector assembly and method of manufacturing" discloses a multi-connector electronic assembly incorporating different noise shield elements which reduce noise interference and increase performance. In one embodiment, the connector assembly comprises a plurality of connectors with associated electronic components arranged in two parallel rows, one disposed atop the other. The assembly utilizes a substrate shield which mitigates noise transmission through the bottom surface of the assembly, as well as an external "wrap-around shield to mitigate noise transmission through the remaining external surfaces. In a second embodiment, the connector assembly further includes a top-to-bottom shield interposed between the top and bottom rows of connectors to reduce noise transmission between the rows of connectors, and a plurality of front-to-back shield elements disposed between the electronic components of respective top and bottom row connectors to limit transmission between the electronic components.

U.S. Pat. No. 6,761,595 to Zheng, et al. issued Jul. 13, 2004 entitled "Electrical connector" discloses an electrical connector has an insulative housing and a plurality of subassemblies. Each subassembly has a base member, a first and second printed circuit boards, a pair of insert portions mounted on corresponding PCBs, and a plurality of terminals insert molded in the insert portions. One of the insert portions has a plurality of first positioning posts and first mounting holes, the other insert portion has a plurality of second positioning posts and mounting holes second stably engaging with the first mounting holes and the first positioning posts of the former. The base member has a plurality of magnetic coils connecting with the terminals.

U.S. Pat. No. 6,769,936 to Gutierrez, et al. issued. Aug. 3, 2004 entitled "Connector with insert assembly and method of manufacturing" discloses a modular plug connector assembly incorporating a substantially planar, low profile removable insert assembly with associated substrate disposed in the rear portion of the connector housing, the substrate adapted to optionally receive one or more electronic components. In one embodiment, the connector assembly comprises a single port with a single insert assembly. The conductors and terminals of the connector are retained within respective molded carriers which are received within the insert assembly. A plurality of light sources (e.g., LEDs) is also received within the housing, the conductors of the LEDs mated with conductive traces on the substrate of the insert assembly. In another embodiment, the connector assembly comprises a multi-port "1×N" device.

U.S. Pat. No. 6,773,302 to Gutierrez, et al. issued Aug. 10, 2004 entitled "Advanced microelectronic connector assembly and method of manufacturing" discloses a modular plug connector assembly incorporating a substrate disposed in the rear portion of the connector housing, the substrate adapted to receive one or more electronic components such as choke coils, transformers, or other signal conditioning elements or magnetics. In one embodiment, the connector assembly comprises a single port pair with a single substrate disposed in the rear portion of the housing. In another embodiment, the assembly comprises a multi-port "row-and-column" housing with multiple substrates (one per port) received within the rear of the housing, each substrate having signal conditioning electronics which condition the input signal received from the corresponding modular plug before egress from the connector assembly. In yet another embodiment, the connector assembly comprises a plurality of light sources (e.g., LEDs) received within the housing.

U.S. Pat. No. 6,786,772 to Liu issued Sep. 7, 2004 entitled "Modulated connector" discloses a modulated connector includes an input module, a transfer module and an applied terminal module. The input module has at least one resilient leg set adapted to connect to other electrical elements. The transfer module is connected to the input module via a circuit board and has a substantially U-shaped pin seat with two sets of pins to correspond to the side holes of the circuit board. The applied terminal module is connected to the transfer circuit board and has two side circuit boards respectively and electrically connected to the transfer module and a base electrically connected to the side circuit boards and provided with multiple contacting pins extending through the base for connection with another electrical device.

U.S. Pat. No. 6,848,943 to Machado, et al. issued Feb. 1, 2005 entitled "Shielded connector assembly and method of manufacturing" discloses a shielded modular plug connector assembly incorporating a removable insert assembly disposed in the connector housing, the insert assembly adapted to optionally receive one or more electronic components. In one exemplary embodiment, the connector assembly comprises a single port connector with integral shielded housing and dual-substrate insert assembly. The housing is advantageously formed using a metal casting process which inherently shields the connector (and exterior environment) from EMI and other noise while allowing for a reduced housing profile.

U.S. Pat. No. 6,962,511 to Gutierrez, et al. Nov. 8, 2005 entitled "Advanced microelectronic connector assembly and method of manufacturing" discloses an advanced modular plug connector assembly incorporating a substrate disposed in the rear portion of the connector housing, the substrate adapted to receive one or more electronic components such as choke coils, transformers, or other signal conditioning elements or magnetics. In one embodiment, the connector assembly comprises a single port pair with a single substrate disposed in the rear portion of the housing. In another embodiment, the assembly comprises a multi-port "row-and-column" housing with multiple substrates (one per port) received within the rear of the housing, each substrate having signal conditioning electronics which condition the input signal received from the corresponding modular plug before egress from the connector assembly. In yet another embodiment, the connector assembly comprises an indicator assembly having a plurality of optically transmissive conduits, the assembly being disposed largely outside the external noise shield of the connector and removable therefrom. Methods for manufacturing the aforementioned embodiments are also disclosed.

U.S. Pat. No. 7,241,181 to Machado, et al. issued Jul. 10, 2007 entitled "Universal connector assembly and method of manufacturing" discloses an advanced modular plug connector assembly incorporating an insert assembly disposed in the rear portion of the connector housing. In one embodiment, the connector has a plurality of ports in multi-row configuration, and the insert assembly includes a substrate adapted to receive one or more electronic components such as choke coils, transformers, or other signal conditioning elements or magnetics. The substrate also interfaces with the conductors of two modular ports of the connector, and is removable from the housing such that an insert assembly of a different electronics or terminal configuration can be substituted therefor. In this fashion, the connector can be configured to a plurality of different standards (e.g., Gigabit Ethernet and 10/100). In yet another embodiment, the connector assembly comprises a plurality of light sources (e.g., LEDs) received within the housing, Methods for manufacturing the aforementioned embodiments are also disclosed.

Accordingly, it would be most desirable to provide an improved electrical connector (e.g., modular jack) design that would provide reliable and superior electrical and noise performance, while also providing application flexibility, including aspects desirable in low profile connector applications. Such a connector design would also minimize costs by specifying that some of the electrical components necessary for the electrical connector filter circuit be carried external to the electrical connector, yet within the electrical connector footprint to minimize electrical connector size. The improved connector design would also facilitate easy assembly, as well as be amenable to integration into a multi-port connector assembly.

SUMMARY OF THE INVENTION

The present invention provides, inter alia, a low cost connector (as compared to prior art designs) while offering novel features that improve the manufacturability of the connector assembly. The connector provides a means to interconnect a plug(s) to a circuit board and, by the use of a common mode choke coil and/or a transformer on each of the plugs signal lines, filter the signal carried through the plug to the circuit board.

In a first aspect of the invention, an electrical connector apparatus is disclosed. In one embodiment, the electrical connector comprises an assembly comprising a magnetically filtered connector for use with various RJ plugs such as the RJ-45 and RI-11. In one variant, the assembly moves the connector's internal PCA, its circuitry and its components to a customer's PCA. Moreover, the exemplary embodiment locates those components within the confines of the connector's PCB footprint or adjacent to it. It also locates the connector's circuitry to the customers PCA; and provides a path for the connector's filtered signals to its circuitry on the customers PCA.

In another embodiment, an electrical connector mountable on a printed circuit board in a telecommunications apparatus is disclosed. The electrical connector comprises an insulative housing comprising one or more electronic components; a plurality of electrical conductors in signal communication with the one or more electronic components and adapted to interface with a plug; and a plurality of terminals in signal communication with the one or more electronic components. The plurality of terminals are adapted to interface with one or more externally mounted electronic components on the printed circuit board thereby filtering signals passing between the plurality of electrical conductors and the printed circuit board. The externally mounted electronic components are mounted within the footprint of the electrical connector.

In one variant, the electrical connector further comprises an organizer assembly comprising an insulative insert with the plurality of electrical conductors in signal communication with the one or more electronic components.

In yet another variant, the insulative housing comprises at least one port cavity and at least one electronic component cavity; wherein individual ones of the at least one port cavity are adapted to receive the organizer assembly such that individual ones of the at least one port cavity are inaccessible from the at least one electronic component cavity when the organizer assembly is received within its respective port cavity.

In yet another variant, the electrical connector comprises a vertically mounted electrical connector comprising a connector port and an interface surface to the printed circuit board wherein the one or more electronic components are positioned within the insulative housing so as to not reside between said connector port and the interface surface.

In yet another variant, the plurality of terminals in signal communication with the one or more electronic components are distributed evenly throughout the insulative housing so that individual ones of the one or more electronic components are substantially equidistant from its respective terminal.

In yet another variant, the insulative housing is adapted to accommodate the one or more externally mounted electronic components substantially between the insulative housing and the printed circuit board.

In yet another variant, the one or more externally mounted electronic components comprise chip-like electronic components and the one or more electronic components comprise toroidal inductive devices.

In yet another embodiment, the connector assembly comprises a connector housing comprising a plug receiving recess and an electronic component receiving recess; a terminal insert, the terminal insert comprising a plurality of terminals residing at least partly within the plug receiving recess and the electronic component recess; and an electronic component residing within the electronic component receiving recess, the electronic component comprising a plurality of leads, at least one of the plurality of leads connected directly to one of the plurality of terminals.

In one variant, the connector housing comprises a vertically mounted connector housing wherein the terminal insert comprises an insulating header portion having a bottom surface; and wherein the electronic component is disposed substantially above the bottom surface.

In another variant, the electronic component comprises a wound toroid the one of the plurality of terminals comprises a notched end adapted to receive the at least one of the plurality of leads.

In yet another variant, the electronic component receiving recess comprises a depth, the depth permitting the electronic component to be mass terminated to the one of the plurality of terminals without damaging the electronic component.

In yet another embodiment, the connector assembly, comprises a connector housing comprising a plug receiving recess defined by a plug receiving surface and an electronic component receiving recess; a terminal insert, the terminal insert comprising a plurality of terminals residing at least partly within the plug receiving recess and the electronic component recess and further comprising an insulative portion comprising a bottom surface, the bottom surface; and a plurality of electronic components residing within the electronic component receiving recess, the plurality of electronic components residing in a substantially coplanar fashion and further residing substantially between the level of the plug receiving surface and the level of the bottom surface.

In one variant, the plug receiving surface and the bottom surface are substantially parallel in orientation with respect to one another.

In another variant, the plug receiving recess is adapted to receive the terminal insert such that the plug receiving recess is inaccessible from the electronic component receiving recess when the terminal insert is received within the connector housing.

In yet another variant, the connector housing comprises a vertical mounted connector housing that comprises a substantially L-shape.

In yet another variant, the terminal insert comprises one or more locking features, the one or more locking features adapted to interface with one or more receiving elements on the connector housing.

In yet another variant, the terminal insert is shaped so as to separate the plug receiving recess from the electronic component receiving recess when the one or more locking features is engaged with the one or more receiving elements.

In a second aspect of the invention, a low-profile connector assembly is disclosed. The low profile connector assembly comprises a vertical mounted connector housing comprising a connector port and an interface surface, the vertical mounted connector housing comprising a plurality of terminals extending below the interface surface; a plurality of electronic components in signal communication with at least a portion of the plurality of terminals; wherein the plurality of electronic components are disposed within the vertical mounted connector housing such that they do not reside between the connector port and the interface surface.

In one variant, the connector assembly further comprises an organizer assembly comprising an insulative insert; and a plurality of electrical conductors in signal communication with the one or more electronic components.

In another variant, the connector assembly further comprises an electronic component cavity, wherein the connector port is adapted to receive the organizer assembly such that the connector port is inaccessible from the electronic component cavity when the organizer assembly is received within the connector port.

In yet another variant, the plurality of terminals in signal communication with the plurality of electronic components are distributed evenly throughout the connector housing so that individual ones of the plurality of electronic components are substantially equidistant from its respective terminal.

In yet another variant, the connector housing comprises an external electronic component cavity adapted to accommodate one or more externally mounted electronic components substantially between the connector housing and an external printed circuit board.

In yet another variant, the one or more externally mounted electronic components comprise chip-like electronic components and the plurality of electronic components comprises toroidal inductive devices.

In yet another variant, the vertical mounted connector housing comprises a substantially L-shape.

In yet another variant, the insulative insert comprises one or more locking features, the one or more locking features adapted to interface with one or more receiving elements on the vertical mounted connector housing.

In yet another variant, the insulative insert is shaped so as to separate the connector port from an electronic component cavity when the one or more locking features is engaged with the one or more receiving elements.

In yet another variant, the vertical mounted connector housing comprises an electronic component cavity adapted to house the plurality of electronic components and the plurality of electrical conductors in signal communication with the one or more electronic components each comprise a termination end; wherein the electronic component cavity is deep enough to permit the mass termination of the termination end of the electrical conductors without damaging the plurality of electronic components housed within the electronic component cavity.

In a third aspect of the invention, a connector assembly for use with discrete electronic components located on an external printed circuit board is disclosed.

In a fourth aspect, a substrate-less modular connector or jack is disclosed.

In a fifth aspect of the invention, a connector useful for Voice-over-IP (VoIP) applications is disclosed.

In a sixth aspect of the invention, a method of manufacturing the aforementioned connector apparatus is disclosed. In one embodiment, the method comprises forming a connector housing; winding one or more coil assemblies; inserting the one or more coil assemblies into the connector housing; and specifying one or more electronic components to be mounted on the circuit board underneath the connector housing.

In one variant, the one or more electronic components comprise chip-like electronic components.

In another variant, the method further comprises forming an organizer assembly; and inserting the organizer assembly into the connector housing.

In a seventh aspect of the invention, a method of doing business is disclosed. In one embodiment, the method comprises designing a filtered connector, assembling a portion of the design components in a connector and specifying the remaining design components to be utilized on the printed circuit board external to the filtered connector.

BRIEF DESCRIPTION OF THE DRAWINGS

The features, objectives, and advantages of the invention will become more apparent from the detailed description set forth below when taken in conjunction with the drawings, wherein.

Figure 1:
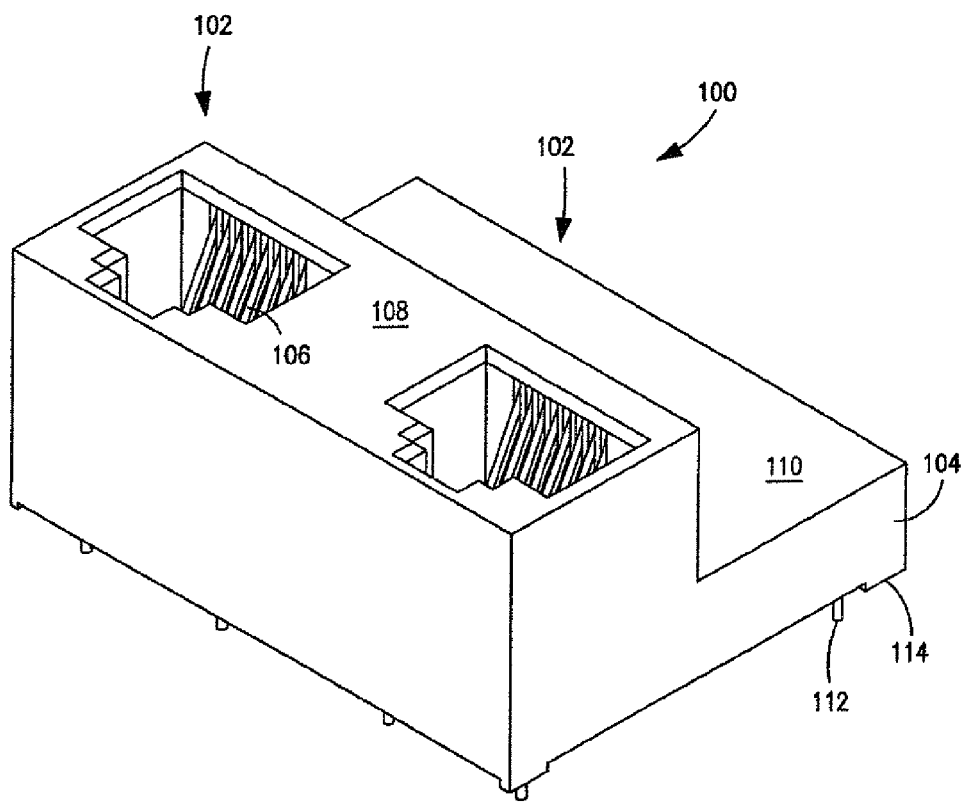
FIG. 1 illustrates a perspective view of a modular jack connector assembly manufactured in accordance with the principles of the present invention.

All Figures disclosed herein are © Copyright 2007 Pulse Engineering, Inc. All rights reserved.

DETAILED DESCRIPTION OF THE PREFERRED EMBODIMENT

Reference is now made to the drawings wherein like numerals refer to like parts throughout.

As used herein, the terms "electrical component" and "electronic component" are used interchangeably and refer to components adapted to provide some electrical and/or signal conditioning function, including without limitation inductive reactors ("choke coils"), transformers, filters, transistors, gapped core toroids, inductors (coupled or otherwise), capacitors, resistors, operational amplifiers, and diodes, whether discrete components or integrated circuits, whether alone or in combination.

As used herein, the term "integrated circuit (IC)" refers to without limitation any type of device, whether single or multiple die, having any level of integration (including without limitation ULSI, VLSI, and LSI) and irrespective of process or base materials (including, without limitation Si, SiGe, CMOS and GaAs). ICs may include, for example, memory devices (e.g., DRAM, SRAM, DDRAM, EEPROM/Flash, and ROM), digital processors, SoC devices, FPGAs, ASICs, ADCs, DACs, transceivers, memory controllers, and other devices, as well as any combinations thereof.

As used herein, the term "memory" includes any type of integrated circuit or other storage device adapted for storing digital data including, without limitation, ROM. PROM, EEPROM, DRAM, SDRAM, DDR/2 SDRAM, EDO/FPMS, RLDRAM, SRAM, "flash" memory (e.g., NAND/NOR), and PSRAM.

As used herein, the terms "microprocessor" and "digital processor" are meant generally to include all types of digital processing devices including, without limitation, digital signal processors (DSPs), reduced instruction set computers (RISC), general-purpose (CISC) processors, microprocessors, gate arrays (e.g., FPGAs), PLDs, reconfigurable compute fabrics (RCFs), array processors, secure microprocessors, and application-specific integrated circuits (ASICs). Such digital processors may be contained on a single unitary IC die, or distributed across multiple components.

As used herein, the tem). "signal conditioning" or "conditioning" shall be understood to include, but not be limited to, signal voltage transformation, filtering and noise mitigation, signal splitting, impedance control and correction, current limiting, capacitance control, and time delay.

While the present invention is discussed largely in the context of telecommunications applications requiring low-profile connector profiles, the invention is not so limited. In fact, the present invention may be utilized or combined with other types of technologies and capabilities such as e.g., using one or more integrated circuits within or in conjunction with the connector assembly.

Mechanical Embodiments

Prior art magnetically filtered connectors typically utilize an internal printed circuit board ("PCB") or other substrate to carry the input signals through internal circuitry connecting numerous internal transformer coils and chokes to various internal electrical components for filtering applications and then to pins located in specific locations relative to the customers printed circuit assembly ("PCA"). While prior art designs typically focused on customer manufacturing convenience (by internalizing all the filter circuitry within the connector itself), cost is becoming an ever important factor in the design of these integrated component connectors. In order to reduce the total "on-the-board" cost of a filtered connector, while still providing manufacturing convenience to a customer, it would be prudent for the connector manufacturer to locate any functional parameters of the connector design at the least expensive point in the overall process of manufacturing the customer's completed circuit board assembly.

The inventor herein has realized that by transferring some of those functional filtered-connector design elements, which are currently provided at a greater expense by the filtered connector manufacture, to the customer's PCA it will reduce the overall total cost to the customer while minimizing customer inconvenience. This is largely because some of the functionality associated with the connector's filtering circuitry can be incorporated into the customer's PCA at little or no added cost to the customer. This is especially desirable in applications where the customer generally has a much higher utilization of similar electrical components (e.g. chip capacitors, resistors, etc.) utilized in the filtered-connector design elements and therefore can purchase them at a lower cost than a connector manufacturer due to economies of scale. Further, the customer can further save costs because the addition of overhead costs associated with these electronic components being passed along to the customer can now be avoided. By moving these connector design elements from the connector to the customers PCB the connector manufacturer can save costs and pass those savings on to the end consumer of the customer's PCA. This cost saving from the price of the connector will be greater than the very minor cost increase born by the customer to provide the additional connector functions on their PCB, thus reducing the total cost of providing a filtered connector solution to the customer. The bottom line is that all parties (i.e. connector manufacturer, PCA manufacturer and end customer) save money utilizing such a business model.

Another cost saving move results from the minimization of the number of components utilized in the connector assembly. Prior art filtered connector assemblies typically include at least a housing, a header assembly to house the electronic components, and a so-called FCC insert. The inventor herein has obviated the need for these three components by combining the housing and the header assembly into a single component. This is exemplified in the L-shaped housing 104 seen in FIG. 1.

Referring now to FIG. 1, a first exemplary embodiment of a magnetically filtered modular jack connector assembly 100 is shown and described in detail. The connector assembly 100 comprises a vertically mounted assembly comprising a generally L-shaped housing 104. In the embodiment shown, the connector assembly is a two (2) port 102 assembly suitable for low profile applications. The L-shaped housing 104 contributes to the low profile nature of the assembly 100 which is useful in certain telecommunications applications where height is at a premium. For instance, in one embodiment, the connector assembly 100 comprises VOIP magnetic circuitry (see FIG. 1A). The connector assembly is shaped so as to accommodate interface circuitry for the VOIP circuitry present on an external circuit board (not shown). The external circuit board housing (not shown) necessitates the connector assembly be low in profile so as to fit with the external PCA housing.

As previously alluded to the connector assembly 100 in the present embodiment comprises two (2) ports 102, although it is appreciated that more or less ports could be added if desired. Further, while shown as two (2) ports 102 in a single row (i.e. a 1×2 connector), the symmetrical nature of the design can be readily adapted for 2×N or N×N applications. Each of the ports 102 is preferably of the registered jack (RJ) style due to their widespread usage in the telecommunications industry. The embodiment shown possesses eight (8) conductors and is of the RJ-45 type; however any number of RJ style ports could be utilized (i.e. RJ-11, RJ-14, etc.) in its place. Further, it is envisioned that the connector assembly 100 may in certain embodiments possess mixed port architecture such as where a first port comprises an RJ-45 port, while a second port comprises an RJ-11 port. In yet another embodiment, it may be desirable to have a first port that comprises an RJ-45 port, while a second port comprises a USB port. Further, it is envisioned that in some embodiments it may be desirable to incorporate ports 102 which implement a "keep-out" feature such as that disclosed in co-owned and co-pending U.S. Provisional Patent Application No. 60/904,464 filed Mar. 1, 2007 and entitled "Connector Keep-Out Apparatus and Methods", the contents of which are incorporated herein by reference in its entirety. This keep-out feature may be especially desirable in mixed port applications.

Figure 1A:
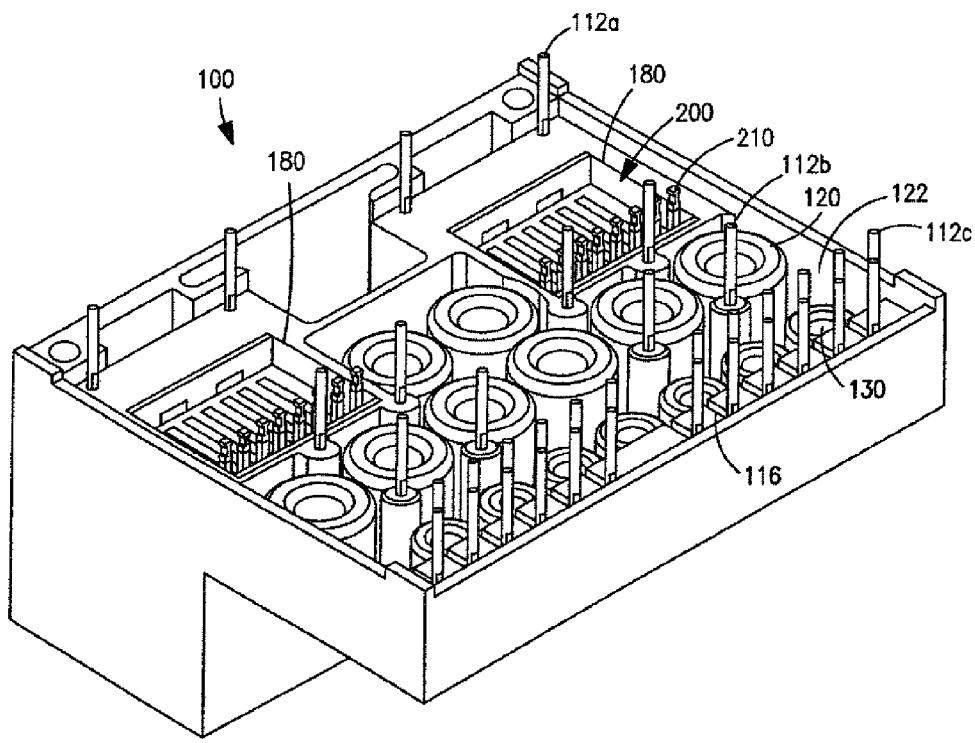
FIG. 1A is a perspective view of the underside of the modular jack connector assembly of FIG. 1.

The modular jack connector assembly 100 comprises two top surfaces 108 and 110, as well as a plurality of terminal pins 112 which interface with an external circuit board and/or PCA (not shown). In addition, the modular jack connector assembly 100 comprises a plurality of standoffs 114 which are useful for, inter alia, providing a wash area below the assembly as is well understood in the electronics arts. Referring now to FIG. 1A, the underside of the modular jack connector assembly 100 is shown in detail. As can be seen, the modular jack connector housing 104 comprises a unitary body having a plurality of terminal pins 112. Within the unitary body resides an electronic component recess 122 adapted to retain a plurality of magnetic components 120, 130. Preferably the magnetic components 120, 130 comprise toroidal magnetics of the type well understood in the electronic arts. In the embodiment shown, the magnetic components comprise four (4) toroidal transformers 120 per port, as well as four (4) toroidal choke coils 130 per port for a total of sixteen (16) toroids in the embodiment shown. The embodiment shown is desirable in VOIP applications. In an alternative embodiment, the magnetic components may be adapted for a PoE or PoE+ ("PoE plus") application.

While the toroidal coils 120, 130 are conventional in design; alternative embodiments may envision non-conventional toroidal coils. For example, the improved toroidal device disclosed in Assignee's co-owned U.S. Pat. No. 6,642,827 entitled "Advanced Electronic Microminiature Coil and Method of Manufacturing" filed Sep. 13, 2000, which is incorporated herein by reference in its entirety, may be used in conjunction with the invention disclosed herein.

Terminal pins 112a are not terminated to any of the magnetic components 120, 130 and are simply utilized for symmetry and for improving the mechanical connection of the assembly 100 to the external circuit board once soldered. Middle terminal pins 112b are utilized to spread the distribution of the terminal pins 112 more evenly throughout the magnetic components. Symmetrically balancing the placement of the magnetic components 120, 130 are desirable to ensure uniformity in electrical performance (e.g. impedance matching, etc.). In the embodiment shown, these terminal pins 112b are utilized for termination to the center taps located on the transformer toroids 120. Terminal pins 112c are located adjacent the edge of the connector assembly 100 and are each located proximate an optional lead in channel 116. These remaining terminal pins 112c are utilized as signal pins (here twenty (20)) and for eight (8) center tap connections to the choke coils 130. The terminal pins 112 are preferably post inserted into the connector assembly housing 104 although the utilization of insert molding may be preferable in certain embodiments. It should also be noted that terminal pins 112a, 112b, 112c and terminal ends 210 are preferably co-planar so as to facilitate mass termination of these conductive features in well known mass termination processes such as wave soldering and the like.

Adjacent the electronic component recess 122 of the connector assembly 100 comprise a plurality of organizer recesses 180. These organizer recesses 180 are adapted to accommodate the organizer assemblies 200 discussed more fully herein below with respect to FIGS. 2-2A. Of particular significance is the utilization of the entire space of the recess 180 when the organizer assembly 200 is inserted. As a result there is no gap that allows access from the electronic component recess 122 to the modular jack connector ports 102 once the organizer assembly 200 is fully inserted. This is significant in that the electronic components 120, 130 will typically be potted with a silicone based material. This is necessary in order to mechanically secure the components 120, 130 as well help provide electrical isolation between electrical potentials present within the component recess 122 and external or internal electronic components or signal or ground planes present on the external circuit board. By providing no gap, this potting compound can not enter into the modular jack connector ports 102, where it can become lodged between the conductor terminals 106 and the comb-like structure of the housing 104 within the connector ports 102, etc.

Figure 1B:
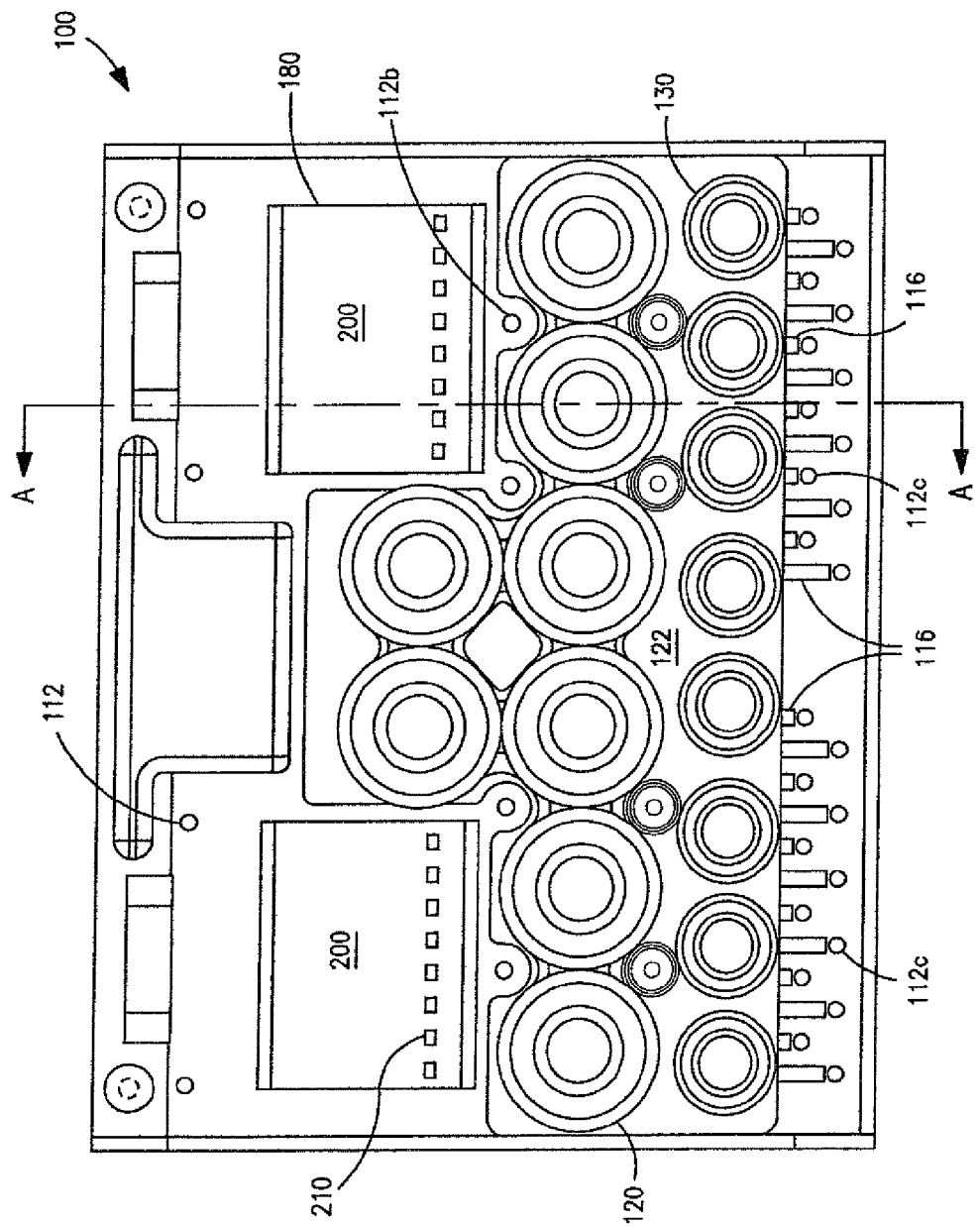
FIG. 1B is a bottom plan view of the modular jack connector assembly of FIGS. 1-1A.

Referring now to FIG. 1B, the lack of a gap between the organizer recess 180 and the organizer assembly 200 is more readily apparent. In addition, as can perhaps best be seen in FIG. 1B, the terminal pins 112c are distributed along the edge of the connector assembly 100 in two distinct rows. This offset increases the distance between adjacent terminal pins 112c, permitting the wires wrapped around these terminal pins 112c to more easily be installed, as well as prevent solder bridging during mass termination as will be discussed more fully herein below. As can also be seen in FIG. 1B, the relative sizing of the channels 116 will accordingly vary based on the relative positioning of its respective terminal pin 112c.

Figure 1C:
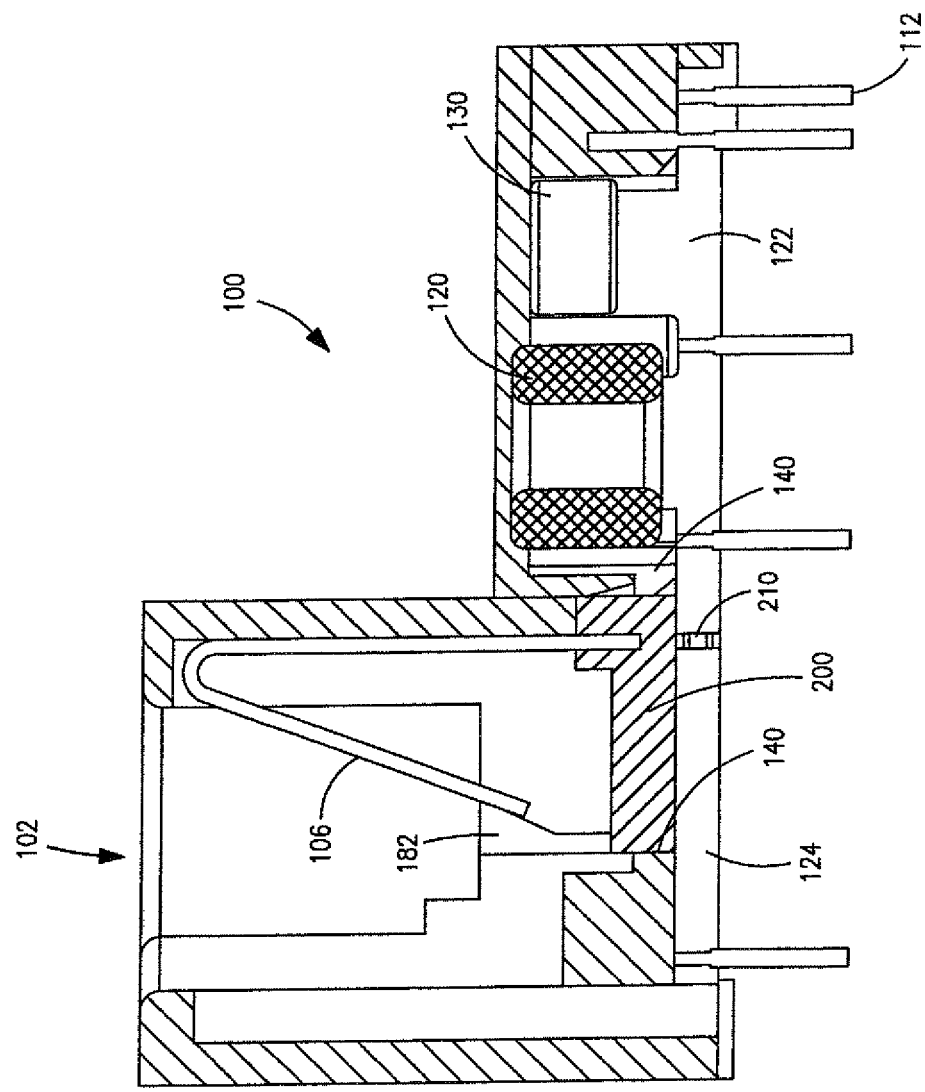
FIG. 1C is a cross sectional view of the modular jack connector assembly of FIGS. 1-1B taken along line A-A.

Referring now to FIG. 1C, a cross sectional view taken across line A-A of FIG. 1B is shown and described in detail. In particular, the interface between the organizer assembly 200 and the connector assembly housing 104 can be seen in more detail. As can be seen, the interface 140 comprises a plurality of snap features which mechanically interlock the organizer assembly 200 into the connector assembly housing 104. Note again that the connector port 102 is physically separated from the component recess 122 with the organizer assembly 200 installed. Another feature of the present embodiment is best illustrated in FIG. 1C. This feature relates to the low profile nature of the connector assembly 100. Specifically, because no electronic components are interspersed between the connector port 102 and the external circuit board (not shown), the height of the vertically mounted connector assembly 100 is minimized. In fact, the only space necessary below the connector port is a small recess 124 to accommodate the wire wrap terminal ends 210 of the organizer assembly 200. As can also be seen, the electronic component recess 122 need not be uniform in depth; in fact, it may be made deeper to accommodate larger coils 120 as illustrated in FIG. 1C.

It should also be noted that the connector assembly 100 may, in certain embodiments, benefit by the addition of an internally mounted printed circuit board. This is particularly useful in cases where it benefits the PCA manufacturer to include electronic components on a circuit board internal to the connector assembly 100. It is further recognized that an external EMI shield could also be placed over the connector housing 104 in certain instances to improve the EMI performance of the connector assembly.

It is also appreciated that in certain embodiments that it may be desirable to include LEDs to the connector port 102 in order to provide signaling of the connector assembly operation of the type well understood in the electronic connector arts. These and other embodiments would be readily implemented by one of ordinary skill given the present disclosure.

Figure 2:
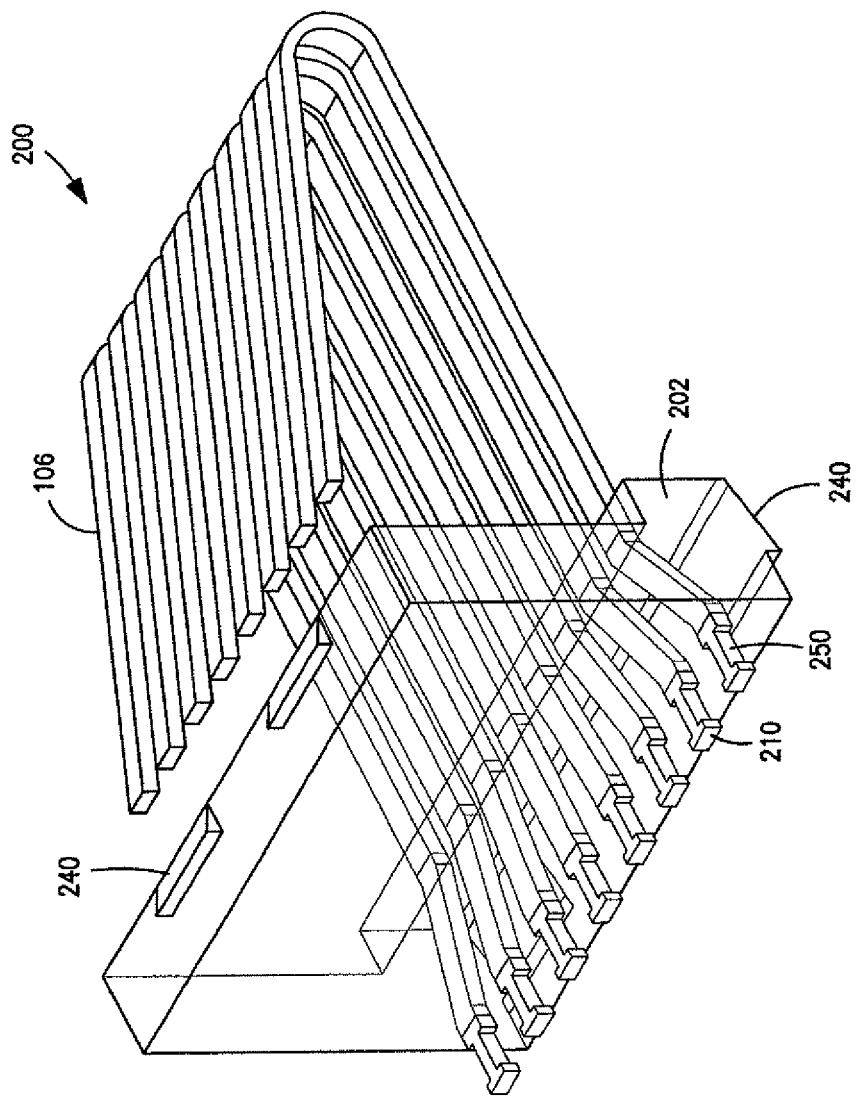
FIG. 2 is a perspective view of the organizer utilized in the modular jack connector assembly of FIGS. 1-1C.

Referring now to FIG. 2, the organizer assembly 200 of the connector assembly 100 is shown and described in detail. The organizer assembly 200 comprises an organizer insert 202 and a plurality of conductors 106. The organizer insert 202 comprises a plurality of retention features 240 that act as cantilever snaps when inserted into the connector assembly housing 104. It is recognized however that these retention features 240 may be obviated in lieu of other retention methods such as through use of epoxies, heat staking and the like. Each of the plurality of conductors 106 comprises a termination end 210 having a notched cutout 250. The notched cutout 250 is utilized for the wire wrapping of the magnetic component terminations. The organizer insert 202 also preferably comprises a high temperature polymeric material such as nylon. This allows the termination ends 210 to be mass terminated by immersion soldering as will be discussed more fully herein below.

Figure 2A:
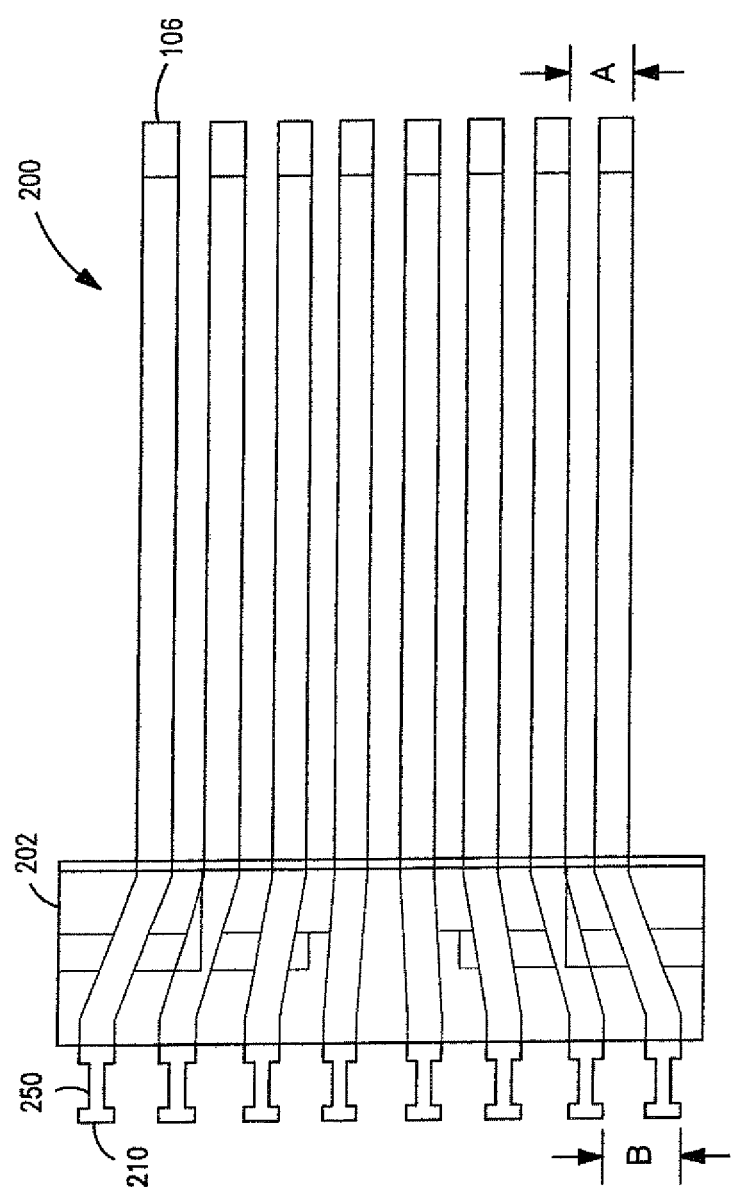
FIG. 2A is a top plan view of the organizer shown in FIG. 2.

Referring now to FIG. 2A, another feature of the conductors 106 becomes more readily apparent. As can be seen, the pitch "B" at the termination end 210 is larger in size than the pitch "A" at the opposing end. This is because the pitch dimension "A" is typically specified in a standard and has a dimension that is typically not desirable for mass termination. Therefore, the pitch "B" at the termination end is expanded in order to increase the distance between conductors 106. This facilitates the mass termination of magnet wire, etc. to the conductors 106.

It should also be noted that in certain embodiments a gap between the portions of the FCC conductors that exit the organizer assembly towards the plug recess and the housing wall to which that portion of the leads are parallel is desirable. This gap provides additional deflection length from the top surface of the connector to the organizer for the leads to move toward when a plug is inserted. This additional deflection increases the length of the entire deflection beam of the FCC lead and reduces the stress on the FCC bend (which can be as high as 150 degrees) where the bending stress is normally concentrated.

Figure 3:
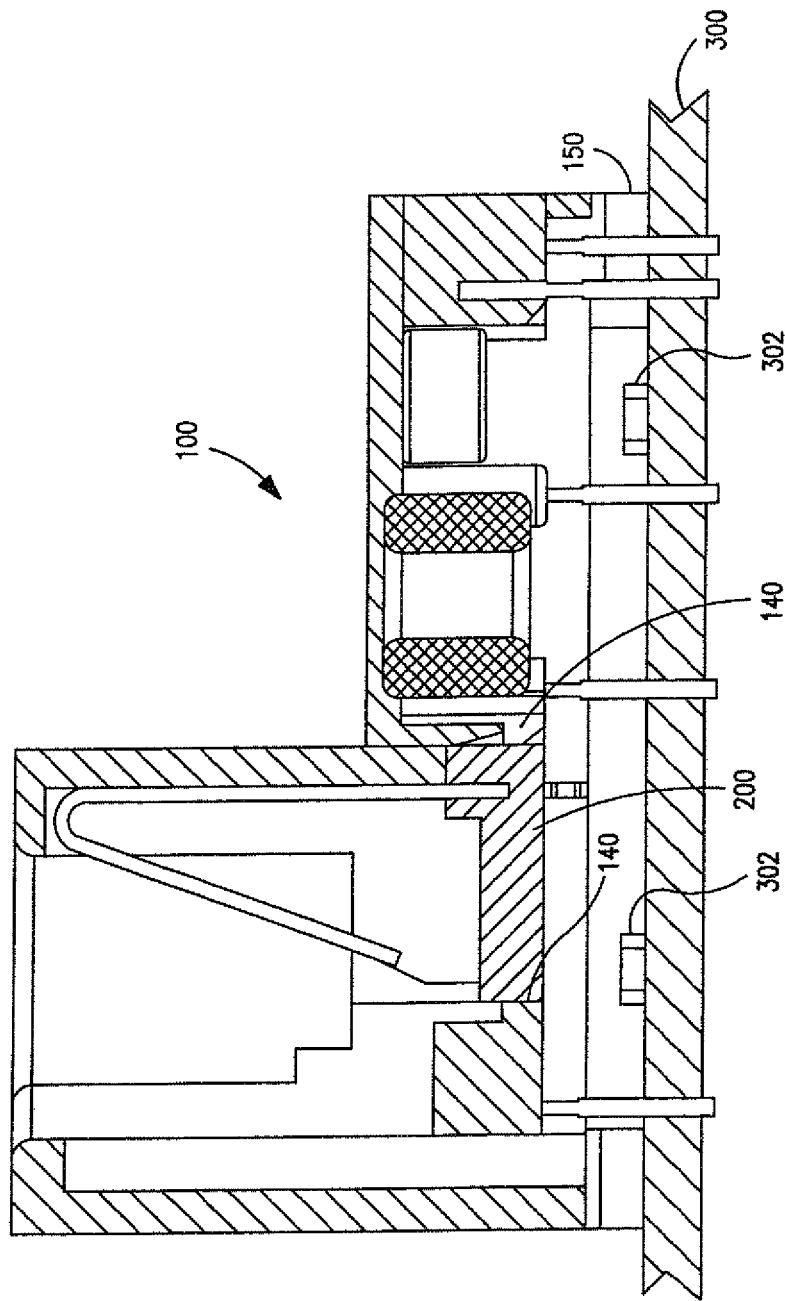
FIG. 3 is a cross sectional view of a second embodiment of a modular jack connector assembly.

Referring now to FIG. 3, a salient advantage of the present connector assembly 100 is now readily apparent. In prior art filtered connectors, a printed circuit board would often be implemented within a connector assembly to incorporate the required discrete electronic components necessary for the operation of the circuit. In the present invention however, this connector printed circuit board, which includes associated electronic component circuitry, is removed from the connector assembly 100 in some embodiments. The connector housing 104 optionally comprises standoffs 150 adapted to interface with the customer's mother board 300. These standoffs 150 provide a predetermined distance between the bottom of the connector 100 and the customer's mother board 300. The resulting cavity space will accommodate the connector specified components 302 now being mounted on the customer's PCB 300 when the connector 100 is mounted over these components 302. This is accomplished by giving the customer an electronic component circuit board layout for the connector's filtering circuitry. The connector assembly 100 includes interface circuitry (e.g. the interfacing pins 112) adapted to be placed in electrical communication with the circuitry now present on the customers board 300. The pertinent specifications, including PCB layout location requirements for the electrical components and the PCB footprint of the connector are provided to the customer. The customer adds the filtering circuitry to his own circuitry during the mother board's layout design phase adds the filtering electrical components to their own board purchased parts and builds the board. The connector assembly 100 is then mounted to the customers PCB 300 exactly where it would have been without this cost saving device. It should also be recognized that since the connector assembly 100 of the present invention is mounted to the customers PCB 300 on top of the customer mounted electrical components 302; the connector assembly 100 doesn't require any additional board space over prior art designs.

Figure 4:
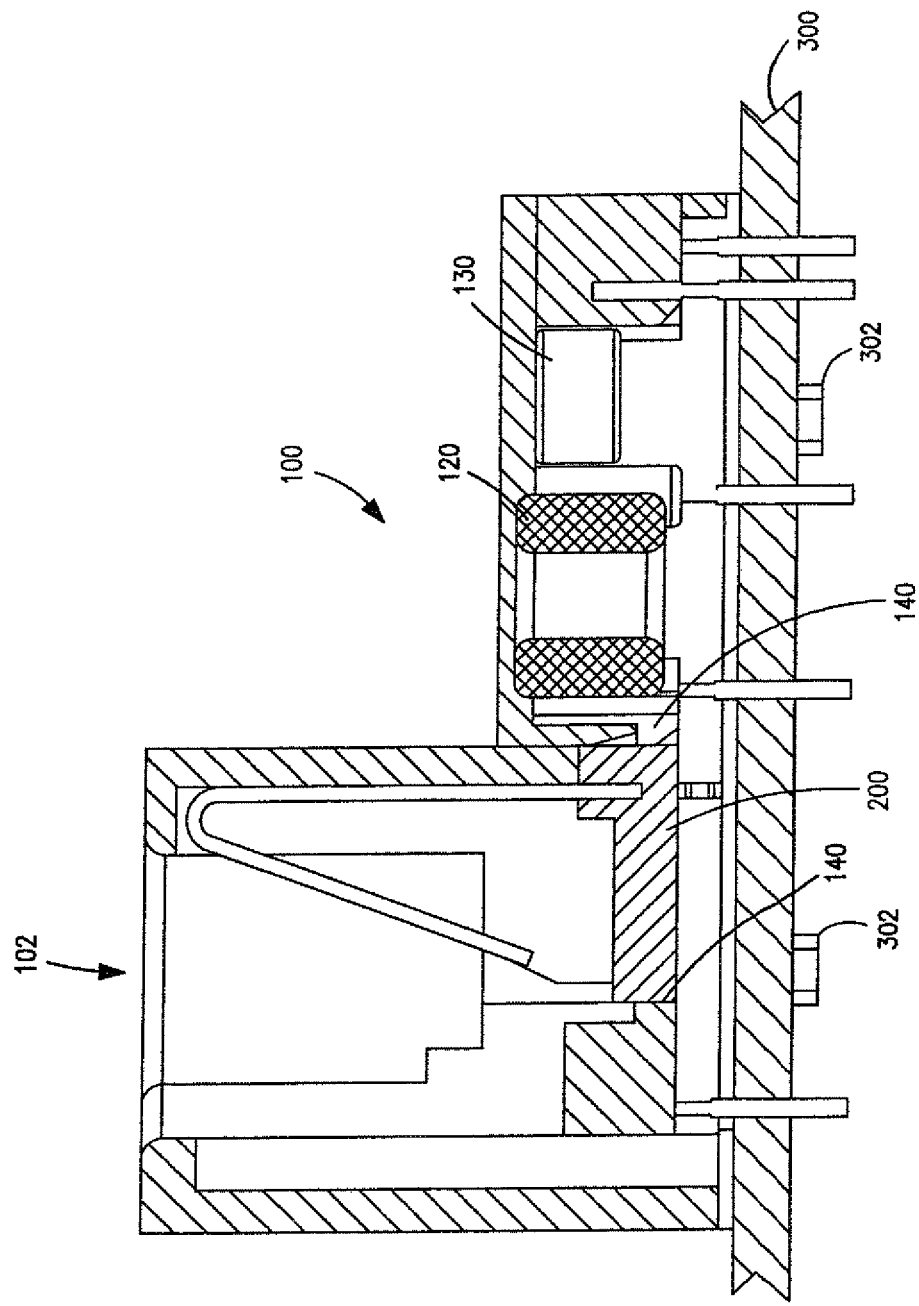
FIG. 4 is a cross sectional view of a third embodiment of a modular jack connector assembly.

Referring now to FIG. 4, yet another embodiment of a connector assembly 100 in accordance with the principles of the present invention is shown and described in detail. In the embodiment shown, the standoffs (FIG. 3, 150) are obviated in order to make the connector assembly 100 as low in profile as possible. Again the internal magnetic components 120, 130 are shifted out from underneath the connector port 102. The external electronic components 302 on the customer printed circuit board 300 are shifted to the far side of the customer's board 300. Accordingly space is not needed under the connector assembly 100 to accommodate these components 302. Another advantage is that improved electrical isolation is provided between the magnetic components 120, 130 and the external electronic components 302 via the interposed printed circuit board 300. This permits, in certain embodiments, a lower profile connector because spacing between components 120, 130 and 302 need not be considered due to the placement of the electronic components 302.

Figure 5:
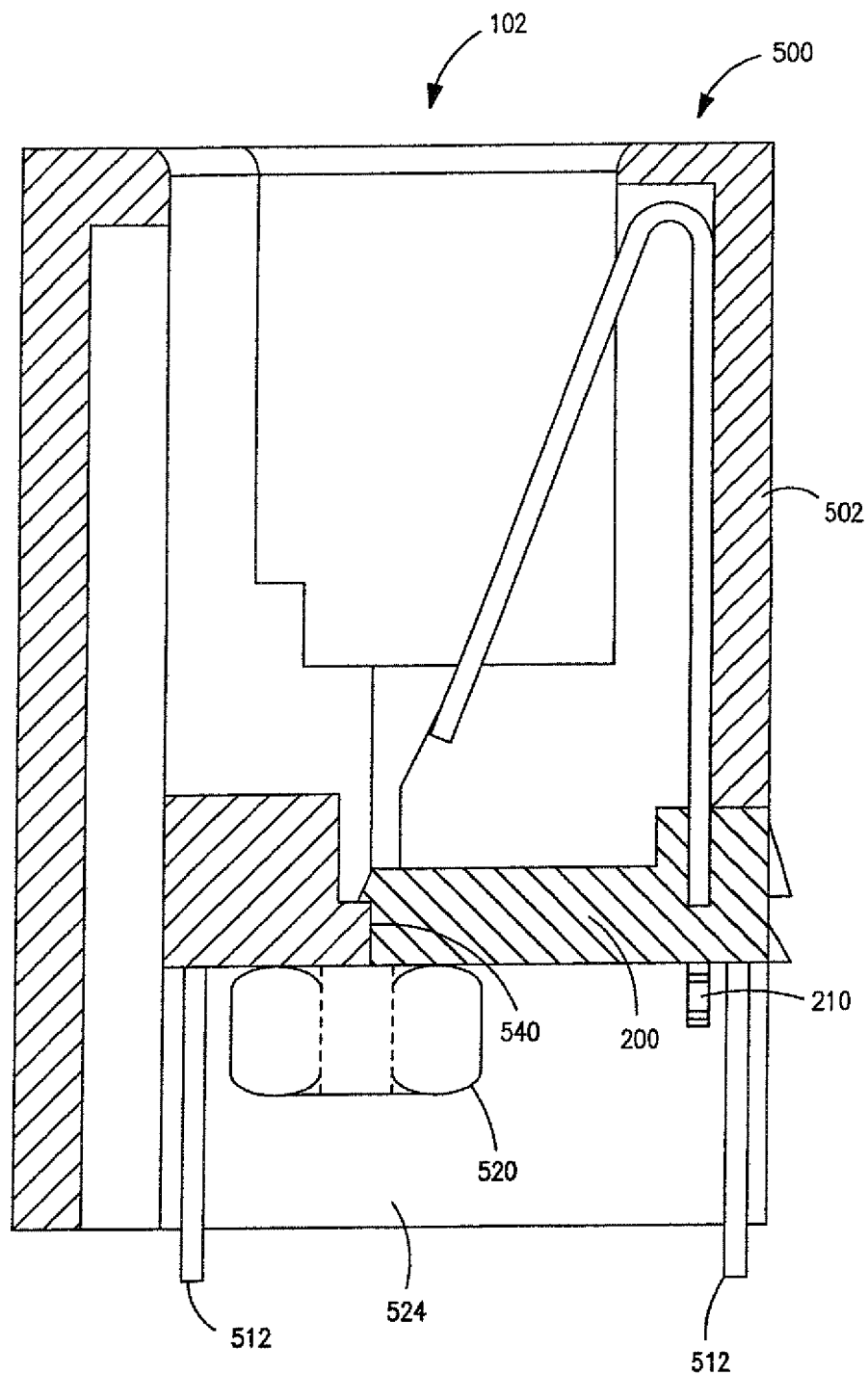
FIG. 5 is a cross sectional view of a fourth embodiment of a modular jack connector assembly.

Referring now to FIG. 5, yet another embodiment of a connector assembly 500 in accordance with the principles of the present invention is shown and described in detail. In the embodiment shown, a vertically mounted connector assembly 500 which must minimize its footprint (at the expense of height) is shown and described in detail. Here, the magnetic components 520 are mounted on the underside of the organizer assembly 200. The magnetic components are mounted to the termination ends 210 of the organizer assembly 200 and the signal pins 512 as discussed previously. The magnetic components 520 are also received within a cavity 524 which also has plenty of room to accommodate externally mounted electronic components (not shown). The organizer assembly 200 seals off the component cavity 524 from the connector port 102 via snap features 540 between the organizer assembly 200 and the connector assembly housing 502. This allows the cavity 524 to be potted with any number of compounds well understood in the art (such as silicone) without permitting the potting compound to foul up the internal workings of the connector port 102.

Figure 6:
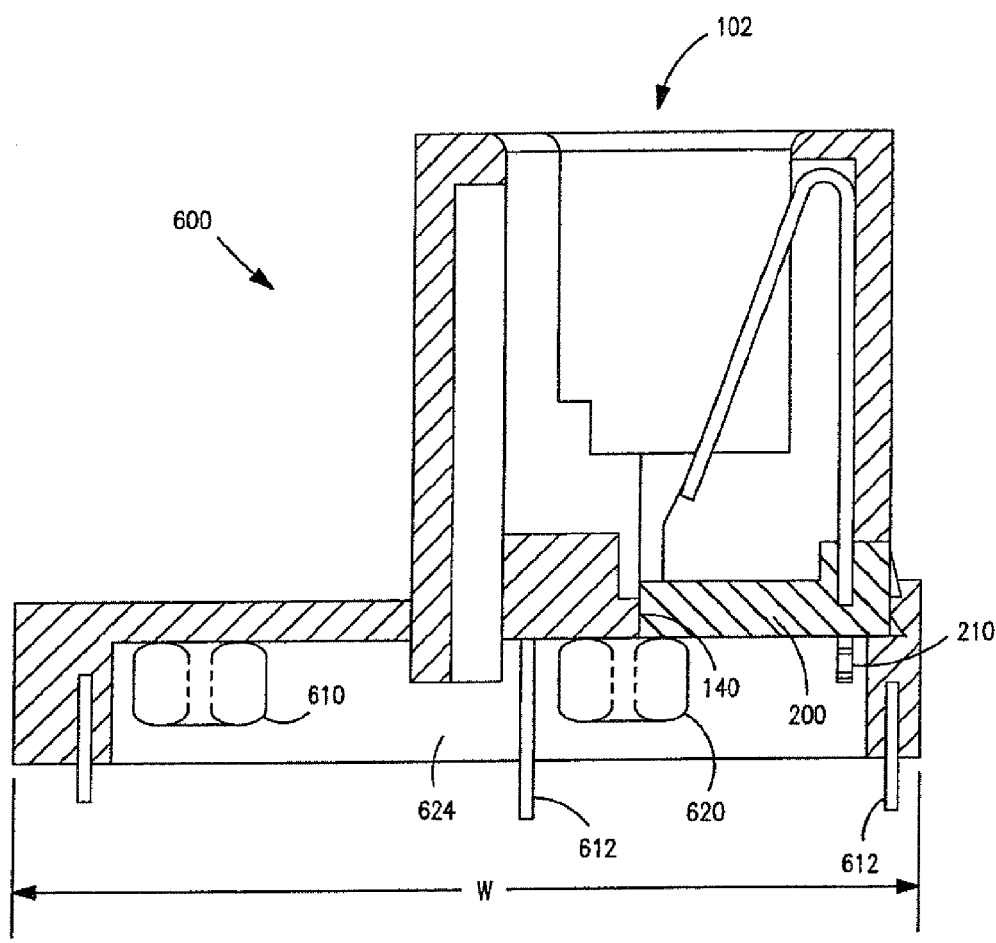
FIG. 6 is a cross sectional view of a fifth embodiment of a modular jack connector assembly.

Referring now to FIG. 6, yet another embodiment of a connector assembly 600 is shown and described in detail. As illustrated in FIG. 1, the previous embodiments discussed comprise a "tab out" configuration. In other words, the tab of the inserted modular plug faces away from internals of the modular jack connector assembly 100. However, this configuration has some potential drawbacks. As can be seen in FIG. 6, a "tab in" configuration is shown for the connector assembly 600. That is, the tab of the inserted modular plug (not shown) will face inward towards the center of the connector assembly 600. What this ultimately means is that the termination ends 210 of the organizer assembly 200 are now positioned towards the edge of the connector assembly 600. Because of this, electronic components 620 can be positioned underneath the connector port 102 resulting in a reduced width dimension "W". This of course can be at the expense of the overall height of the connector assembly. Similar to the embodiment discussed in FIG. 1, the connector assembly 600 illustrated in FIG. 6 possesses a plurality of terminal pins 612, electronic and/or magnetic components 610, 620 all resident within a component cavity 624.

It will be appreciated that the features of the present inventions can be implemented in conjunction with or in the context of any number of different connector, modular, jack, or other paradigms, including without limitation those described in U.S. Pat. No. 6,773,302 entitled "Advanced microelectronic connector assembly and method of manufacturing", U.S. Pat. No. 6,773,298 entitled "Connector assembly with light source sub-assemblies and method of manufacturing", U.S. Pat. No. 6,769,936 entitled "Connector with insert assembly and method of manufacturing", U.S. Pat. No. 6,585,540 entitled "Shielded microelectronic connector assembly and method of manufacturing", U.S. Pat. No. 6,471,551 entitled "Connector assembly with side-by-side terminal arrays", U.S. Pat. No. 6,409,548 entitled "Microelectronic connector with open-cavity insert", U.S. Pat. No. 6,325,664 entitled "Shielded microelectronic connector with indicators and method of manufacturing", U.S. Pat. No. 6,224,425 entitled "Simplified microelectronic connector and method of manufacturing", U.S. Pat. No. 6,193,560 entitled "Connector assembly with side-by-side terminal arrays", U.S. Pat. No. 6,176,741 entitled "Modular Microelectronic connector and method for manufacturing same", U.S. Pat. No. 6,159,050 entitled "Modular jack with filter insert", U.S. Pat. No. 6,116,963 entitled "Two-piece microelectronic connector and method", U.S. Pat. No. 6,062,908 entitled "High density connector modules having integral filtering components within repairable, replaceable sub-modules", U.S. Pat. No. 5,587,884 entitled "Electrical connector jack with encapsulated signal conditioning components", U.S. Pat. No. 5,736,910 entitled "Modular jack connector with a flexible laminate capacitor mounted on a circuit board", U.S. Pat. No. 5,971,805 entitled "Modular jack with filter insert", and U.S. Pat. No. 5,069,641 entitled "Modular jack", each of the foregoing patents incorporated herein by reference in its entirety.

Moreover, the methods and apparatus described in co-pending and co-owned U.S. patent application Ser. No. 11/170,583 filed Jun. 28, 2005 entitled "Universal Connector Assembly and Method of Manufacturing", U.S. patent application Ser. No. 11/387,226 filed Mar. 22, 2006 entitled "Power-Enabled Connector Assembly and Method of Manufacturing", U.S. patent application Ser. No. 11/436,283 filed May 17, 2006 entitled "Bias Current Compensation Apparatus and Method", U.S. patent application Ser. No. 11/399,002 filed Apr. 5, 2006 entitled "Modular Electronic Header Assembly and Methods of Manufacture", U.S. provisional patent application Ser. No. 60/849,432 filed Oct. 2, 2006 entitled "Shield and Antenna Connector Apparatus and Methods", U.S. provisional patent application Ser. No. 60/859,120 Nov. 14, 2006 entitled "Wire-Less Inductive Devices and Methods", and U.S. provisional patent application Ser. No. 60/898,677 filed Jan. 30, 2007 entitled "Low-Profile Connector Assembly and Methods", each of the foregoing being incorporated herein by reference in its entirety, may be used consistent with the aspects of the present invention.

Business Methods

As previously discussed, prior art magnetically filtered connectors typically utilize an internal printed circuit board ("PCB") or other substrate to carry the input signals through internal circuitry connecting numerous internal transformer coils and chokes to various internal electrical components for filtering applications and then to pins located in specific locations relative to the customers printed circuit assembly ("PCA").

The inventor herein has realized that by transferring some of those functional filtered-connector design elements, which are currently provided at a greater expense by the filtered connector manufacture to the customer's PCA, it will reduce the overall total cost to the customer while minimizing customer inconvenience. This is largely because some of the functionality associated with the connector's filtering circuitry can be incorporated into the customer's PCA at little or no added cost to the customer. This is especially desirable in applications where the customer generally has a much higher utilization of similar electrical components (e.g. chip capacitors, resistors, etc.) utilized in the filtered-connector design elements and therefore can purchase them at a lower cost than a connector manufacturer due to economies of scale.

Further, the customer can further save costs because the addition of overhead costs associated with these electronic components being passed along to the customer can now be avoided. By moving these connector design elements from the connector to the customer's circuit board, the connector manufacturer can save costs and pass those savings on to the end consumer of the customer's PCA. Accordingly, a business method is proposed in which the manufacturer of the filtered connector specifies the routing and placement of electronic components on the customer's PCA in order to permit the filtered connector to function properly. The customer will then populate the PCA with these components and then mount the filtered connector on their PCA thereby completing the functional design of the filtered connector assembly.

Methods of Manufacture

Figure 7:
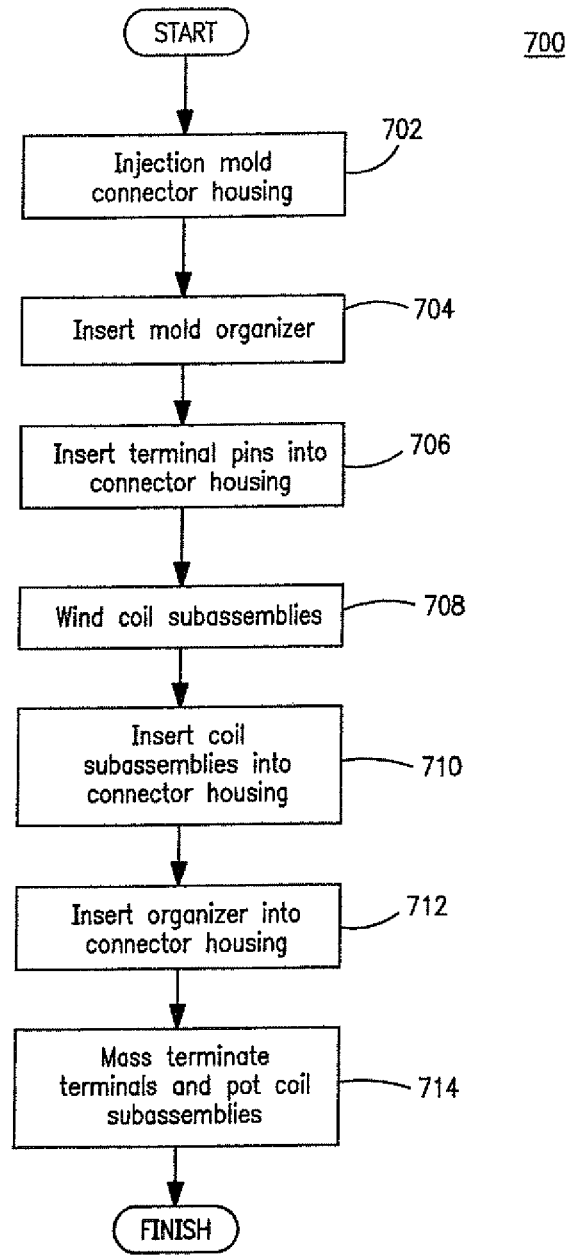
FIG. 7 illustrates a logical flow diagram for a first exemplary method of manufacturing a modular jack connector assembly in accordance with the principles of the present invention.

Referring now to FIG. 7, an exemplary method 700 for manufacturing a modular jack connector assembly is illustrated. At step 702, the modular jack connector assembly housing is formed. Preferably the housing is formed using well known injection molding methods of the type well known in the art. At step 704, the organizer assembly is formed, preferably using similar processes as that utilized in step 702. However, the organizer assembly also includes conductive leads which are stamped from sheet base material, plated and formed into a predefined shape. The conductive leads are then insert molded (i.e. a polymeric material is molded around the conductive leads) at step 704. At step 706, the terminal pins are post inserted into the connector housing formed at step 702. The terminal pins are preferably made from wire stock and inserted into respective holes located in the connector housing. While a post insertion method is presently contemplated, it is appreciated that other methods could be utilized (such as the aforementioned insert molding discussed at step 704).

At step 708, the coil subassemblies utilized in the connector housing are manufactured. In one embodiment this is accomplished by taking formed ferromagnetic toroids and winding magnet wire about the toroidal core. This can be accomplished using manual processes or via automated processes such as that disclosed in co-owned U.S. Pat. No. 3,985, 310 filed Oct. 7, 1974 and entitled "Method for winding ring-shaped articles", the contents of which are incorporated herein by reference in its entirety. At step 710, the coil subassemblies are inserted into the connector housing and the termination ends of the coil subassemblies are wrapped about the terminal pins of the connector housing and the notched ends of the organizer assembly conductors. Referring back to FIG. 1C, it is readily apparent that the magnetic component 120 adjacent to the termination end 210 of the organizer assembly 200 is disposed above the organizer insert 202. This pulls the wires from the magnetic component 120 terminated at the termination end 210 away from the mass terminated surface of the connector assembly 100. This allows for the mass termination of the connector assembly 100 without fear of damaging the magnetic component 120; or without fear of excessive burn back on the terminated wires at, inters alia, termination end 210. In addition, subjecting the leads to the high temperature of the eutectic solder may result in the embrittlement of the leads which can in turn cause high rates of failure during the lifecycle of the product.

Figure 8:
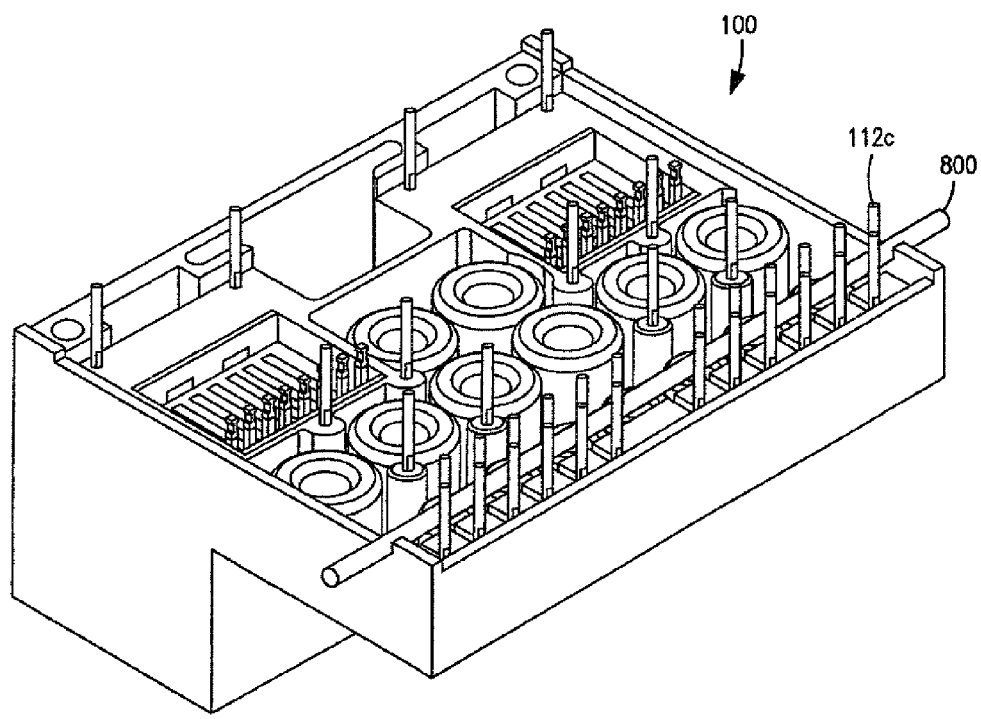
FIG. 8 is a perspective view of the underside of the modular jack connector assembly of FIG. 1 illustrating the use of a strain relief bar for wire termination.

In one embodiment, the connector housing utilizes a strain relief bar 800 (see FIG. 8) which is removed after the wires are terminated to the terminal pins 112c. The strain relief bar 800 forces the assembler to route the wires of the coil assembly over the strain relief bar to terminal pins 112c. Once, the strain relief bar 800 is removed, a sufficient amount of slack is left in the wires to prevent breakage due to excessive tension in the wires.

At step 712, the organizer assembly is inserted into the connector assembly and is locked into place via the mechanical snaps. At step 714, the wire wrapped conductors and terminals are terminated with a eutectic solder. Preferably this is performed using a mass termination technique such as wave soldering of the type well understood in the electronic manufacturing arts. The coil subassemblies are potted to protect the coil subassembly wires and increase the resistance to high voltage potential arcing. As previously discussed, the potting is preferably performed after insertion of the organizer assembly to prevent fouling of the conductor leads in the modular jack port(s).

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A connector assembly, comprising:
   a connector housing comprising a vertically oriented plug receiving recess, and an electronic component receiving recess;
   a conductor terminal insert, the conductor terminal insert comprising a plurality of conductor terminals residing at least partly within the vertically oriented plug receiving recess and the electronic component recess, and an insulating header portion having a bottom surface associated therewith; and
   a plurality of electronic components residing within the electronic component receiving recess and arranged substantially above the bottom surface of the insulating header portion and in a substantially coplanar fashion;
   wherein at least a portion of the conductor terminals have a notched end configured to facilitate the termination of the electronic components with respective ones of the conductor terminals; and
   wherein the vertically oriented plug receiving recess defines a plug receiving direction, the plug receiving direction being substantially orthogonal with the coplanar arrangement of the electronic components.

2. A telecommunications network apparatus, comprising:
   an external printed circuit board (PCB); and
   at least one connector assembly configured to be mounted to the external PCB, the connector assembly comprising:
      an electronic component receiving recess having an open bottom, the electronic component receiving recess configured to receive and substantially house one or more externally mounted electronic components disposed on the external PCB when the connector assembly is mounted thereto;
      one or more magnetic components mounted within the electronic component receiving recess;

a vertically oriented connector port configured to have a plurality of electrical conductors disposed therein, the plurality of electrical conductors configured to interface with a plug and be in signal communication with the one or more magnetic components; and one or more terminals extending from a bottom portion of the connector assembly and in signal communication with at least one of the one or more magnetic components and/or the one or more externally mounted electronic components.

3. The telecommunications network apparatus of claim 2, wherein the connector assembly further comprises an organizer comprising an insulative insert, and wherein the plurality of electrical conductors are disposed within the insulative insert.

4. The telecommunications network apparatus of claim 3, wherein the vertically oriented connector port is configured to receive the insulative insert such that the vertically oriented connector port is inaccessible from the electronic component recess when the insulative insert is received within the vertically oriented connector port.

5. The telecommunications network apparatus of claim 4, wherein the insulative insert comprises one or more locking features configured to interface with one or more receiving elements on the connector assembly.

6. The telecommunications network apparatus of claim 5, wherein the insulative insert is configured to separate the vertically oriented connector port from the electronic component recess when the one or more locking features are engaged with the one or more receiving elements.

7. The telecommunications network apparatus of claim 2, wherein the connector assembly is further configured to have a unitary body.

8. The telecommunications network apparatus of claim 7, wherein at least a portion of the one or more terminals are distributed throughout the unitary body so that individual ones of the one or more magnetic components are substantially equidistant from its respective terminal.

9. The telecommunications network apparatus of claim 7, wherein the unitary body is substantially L-shaped.

10. The telecommunications network apparatus of claim 2, wherein the one or more externally mounted electronic components comprise one or more chip-like electronic components, and the one or more magnetic components comprise wound inductive devices.

11. The telecommunications network apparatus of claim 2, wherein the electronic component receiving recess has a depth sufficient to permit mass termination of a termination end of the one or more terminals without damaging the one or more magnetic components.

12. The telecommunications network apparatus of claim 2, wherein none of the one or more magnetic components and/or the one or more electronic components are disposed between the vertically oriented connector port and the external PCB when the connector assembly is mounted to the PCB, thereby providing a low-profile connector assembly.

13. A connector assembly configured to be mounted to a printed circuit board (PCB), the connector assembly comprising:

a substantially L-shaped unitary housing comprising a vertically oriented plug receiving recess and an electronic component receiving recess;

a conductor terminal insert, the conductor terminal insert comprising a plurality of conductor terminals residing at least partly within the vertically oriented plug receiving recess and the electronic component receiving recess; and a plurality of internally mounted electronic components disposed within the electronic component receiving recess and arranged in a substantially coplanar fashion;

wherein the vertically oriented plug receiving recess is configured to have a plug receiving direction that is substantially perpendicular to the PCB when the connector assembly is mounted thereto;

wherein the electronic component receiving recess defines an open cavity configured to receive one or more externally mounted electronic components disposed on the PCB when the connector assembly is mounted thereto; and wherein none of the internally and/or externally mounted electronic components are disposed between the vertically oriented plug receiving recess and the PCB when the connector assembly is mounted thereto, thereby providing a low-profile connector assembly.

14. The connector assembly of claim 13, wherein the conductor terminal insert comprises an insulating header portion having a bottom surface associated therewith, and wherein the one or more internally mounted electronic components are arranged adjacent to and substantially above the bottom surface of the insulating header portion.

15. The connector assembly of claim 13, wherein at least a portion of the plurality of conductor terminals have a notched end configured to facilitate a termination of the one or more internally mounted electronic components with respective ones of the plurality of conductor terminals.

16. The connector assembly of claim 13, wherein the electronic component receiving recess comprises a depth, the depth configured to permit the one or more internally mounted electronic components to be mass terminated to the plurality of conductor terminals without damaging the one or more internally mounted electronic components.

17. A connector assembly configured to be mounted to a printed circuit board (PCB), comprising:

a vertically oriented plug receiving port configured to interface with a plug;

an electronic component receiving recess comprising a cavity having an open bottom, the electronic component receiving recess configured to receive one or more externally mounted electronic components disposed on to the PCB when the connector assembly is mounted thereto;

a plurality of internally mounted electronic components disposed within the electronic component receiving recess and arranged in a substantially coplanar fashion;

a plurality of electric conductors disposed at least partly within the vertically oriented plug receiving port and the electronic component receiving recess, the plurality of electric conductors configured to be in signal communication with the one or more internally mounted electronic components; and a first plurality of terminals in signal communication with the one or more internally mounted electronic components, the plurality of terminal pins configured to interface with the one or more externally mounted electric components disposed on the PCB when the connector assembly is mounted thereto;

wherein the first plurality of terminal pins are configured to extend from the electronic component receiving recess so that individual ones of the one or more internally mounted electronic components are disposed substantially equidistant from its respective terminal and thereby symmetrically balance the one or more internally mounted electronic components and thereby ensure uniform electrical performance.

18. The connector assembly of claim 17, further comprising a second plurality of terminals extending therefrom and not terminated to any of the one or more internally mounted electronic components.

19. The connector assembly of claim 17, further comprising a third plurality of terminals comprising two rows of off-set terminals extending from a bottom edge of the connector assembly.

20. The connector assembly of claim 17, wherein the first, second, and third plurality of terminals have co-planar termination ends configured to permit mass termination of the first, second, and third plurality of terminals.

21. The connector assembly of claim 17, wherein the connector assembly further comprises an insulative insert configured to retain the plurality of electrical conductors disposed at least partly within the vertically oriented plug receiving port and the electronic component receiving recess.

* * * * *